United States Patent
Wu et al.

(10) Patent No.: US 11,443,803 B2
(45) Date of Patent: *Sep. 13, 2022

(54) MEMORY DEVICE AND METHOD THEREOF

(71) Applicant: TAIWAN SEMICONDUCTOR MANUFACTURING CO., LTD., Hsinchu (TW)

(72) Inventors: Jau-Yi Wu, Hsinchu County (TW); Win-San Khwa, Hsinchu (TW); Jin Cai, Hsinchu (TW); Yu-Sheng Chen, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/095,664

(22) Filed: Nov. 11, 2020

(65) Prior Publication Data

US 2021/0065792 A1 Mar. 4, 2021

Related U.S. Application Data

(63) Continuation of application No. 16/590,232, filed on Oct. 1, 2019, now Pat. No. 10,847,221.

(60) Provisional application No. 62/752,374, filed on Oct. 30, 2018.

(51) Int. Cl.
*G11C 13/00* (2006.01)

(52) U.S. Cl.
CPC ........ *G11C 13/004* (2013.01); *G11C 13/0026* (2013.01); *G11C 13/0028* (2013.01); *G11C 13/0038* (2013.01); *G11C 2013/0052* (2013.01); *G11C 2013/0054* (2013.01)

(58) Field of Classification Search
None
See application file for complete search history.

(56) References Cited

U.S. PATENT DOCUMENTS

| | | | | |
|---|---|---|---|---|
| 8,861,253 | B2 * | 10/2014 | Chang | G11C 11/5685 365/148 |
| 2011/0188292 | A1 * | 8/2011 | Joo | G11C 13/0064 365/148 |
| 2012/0243346 | A1 * | 9/2012 | Chen | G11C 13/0002 365/189.011 |
| 2013/0051119 | A1 * | 2/2013 | Lee | G11C 13/0064 365/148 |
| 2013/0170278 | A1 * | 7/2013 | Chen | H01L 45/08 365/148 |
| 2016/0111153 | A1 * | 4/2016 | Tada | G11C 13/0069 365/148 |
| 2019/0287616 | A1 | 9/2019 | Nakazato | |
| 2020/0051628 | A1 | 2/2020 | Joo | |

* cited by examiner

*Primary Examiner* — Tan T. Nguyen
(74) *Attorney, Agent, or Firm* — Maschoff Brennan

(57) ABSTRACT

A method includes: applying a first signal to memory cells in a memory device, to adjust resistance values of the memory cells; after applying the first signal, applying a second signal to the memory cells other than a first memory cell in the memory cells, to further adjust the resistance values of the memory cells other than the first memory cell. A memory device is also disclosed herein.

20 Claims, 5 Drawing Sheets

MEMORY DEVICE AND METHOD THEREOF

PRIORITY CLAIM AND CROSS-REFERENCE

The present application is a continuation application of U.S. application Ser. No. 16/590,232, filed on Oct. 1, 2019, now U.S. Pat. No. 10,847,221, issued on Nov. 24, 2020, which claims priority benefit of U.S. Provisional Application Ser. No. 62/752,374, filed Oct. 30, 2018, the full disclosures of which are incorporated herein by reference.

BACKGROUND

A memory device can be operated under a write operation and a read operation by applying suitable voltages to the respective word lines and bit lines. The memory device may have various electrical characteristics, and thus the memory device may have various parameters corresponding to the various electrical characteristics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
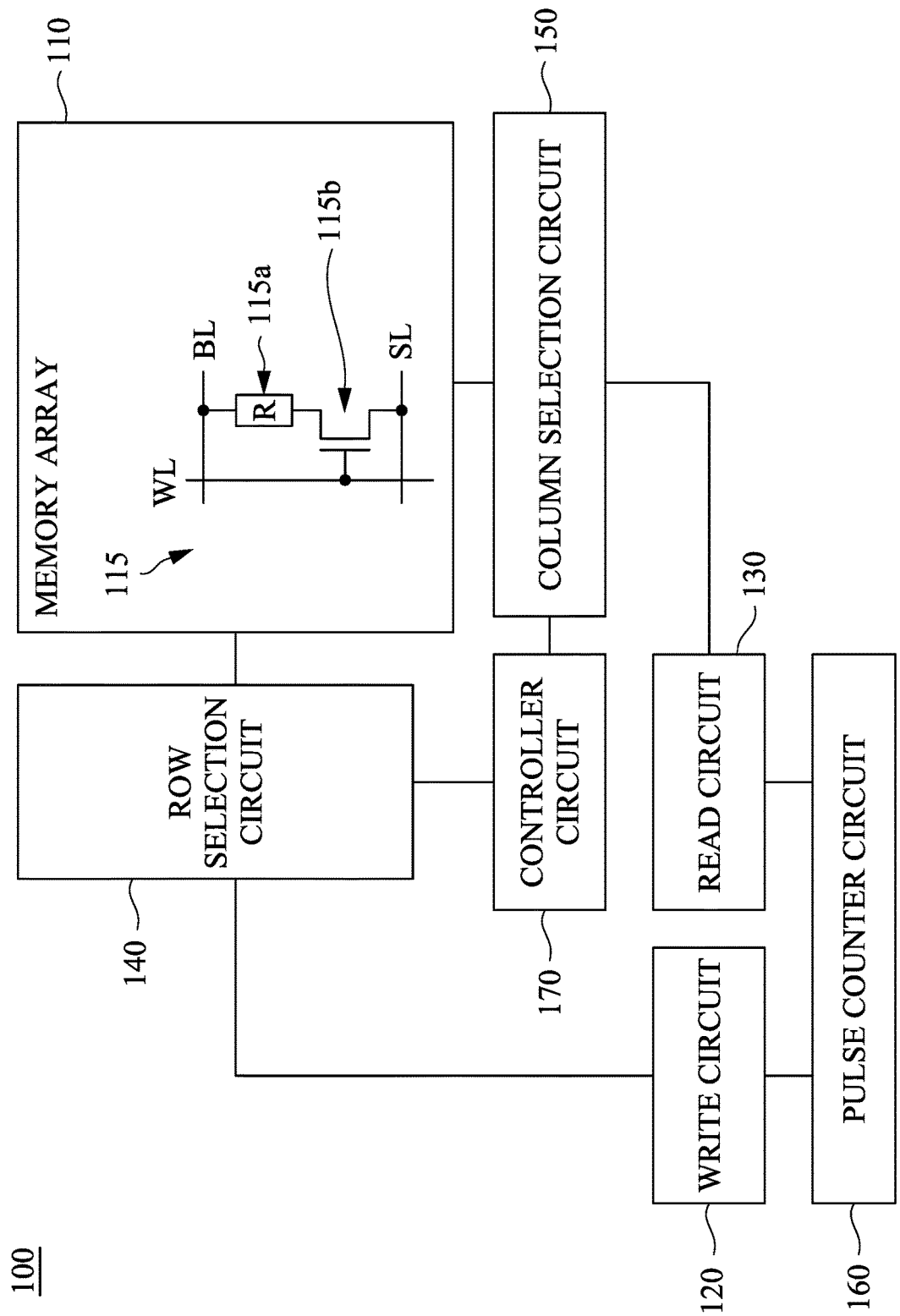
FIG. 1 is a schematic diagram of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is now made to FIG. 1. FIG. 1 is a schematic diagram of a memory device 100, according to some embodiments of the present disclosure. In some embodiments, the memory device 100 is a non-volatile memory with high speed, high capacity, and low energy consumption. In some embodiments, the memory device 100 is able to be switched between operating states, and the operating states correspond to data stored in the memory device 100, which will be discussed in detail below.

For illustration of FIG. 1, the memory device 100 includes a memory array 110, a write circuit 120, a read circuit 130, a row selection circuit 140, a column selection circuit 150, a pulse counter circuit 160, and a controller circuit 170. The memory array 110 is coupled to the write circuit 120 through the row selection circuit 140. The write circuit 120 is configured to generate programming signals to the memory array 110. The memory array 110 is coupled to the read circuit 130 through the column selection circuit 150. The read circuit 130 is configured to read the data stored in the memory array 110. The pulse counter circuit 160 is coupled to the write circuit 120 and the read circuit 130, and is configured to control the programming signals. The controller circuit 170 is coupled to the row selection circuit 140 and the column selection circuit 150, and is configured to send address of the selected memory cell 115.

The above configurations of the memory device 100 are provided for illustrative purposes. Various configurations are within the contemplated scope of the present disclosure. For example, in some other embodiments, the write circuit 120 and the read circuit 130 are included in a write/read driver as a single element in the memory device 100.

In some embodiments, the memory array 110 includes memory cells 115 arranged as an array. The memory cells 115 are configured to store data. The memory cells 115 are coupled to bit lines BL and word lines WL, respectively, and are located at respective intersections of the bit lines BL and the word lines WL. The memory cells 115 are individually addressable by appropriate selections of the corresponding bit line BL and word line WL by using the row selection circuit 140 and the column selection circuit 150, respectively. The memory cells 115 are further coupled to source lines SL, in which the source lines SL are arranged substantially parallel to the bit lines BL. In some embodiments, the source lines SL are configured to receive a reference voltage, including, for example, ground. For convenience of illustration, FIG. 1 shows only one memory cell 115, only one bit line BL, only one word line WL, and only one source line SL, but the present disclosure is not limited thereto.

In some embodiments, the write circuit 120 is configured to write the memory cells 115 in order to store the data into the memory cell 115. To write the memory cell 115, the write circuit 120 is configured to generate, in response to the data to be stored, the programming signals transmitted through the corresponding bit lines BL to the memory cell 115. The write circuit 120 includes components (not shown), for example, amplifiers, comparators, current/voltage generators, or the combination thereof, which are configured for writing the desired values into the selected memory cells 115. In some embodiments, the programming signals are implemented by at least one pulse. In some further embodiments, the programming signals are arranged by pulses with increasing voltage. In some embodiments, the voltage level of each one of the programming signals ranges from about 1V to about 3V. For example, the programming signal has a voltage level of 2V. In some embodiments, the term "voltage level" of the programming signal is also referred to as "pulse height" of the programming signal hereinafter.

In some embodiments, the read circuit 130 is configured to read the data stored in the memory cells 115 by sensing the levels of currents flowing through the memory cells 115. The read circuit 130 includes components (not shown), for example, amplifiers, comparators, current/voltage generators, or the combination thereof, which are required for reading the values stored the selected memory cells 115. In some embodiments, based on the sensed levels of currents, the resistances of the memory cells 115 are able to be calculated, and the stored data in the memory cells 115 are able to be read by transforming the resistances to the digital values.

In some embodiments, the controller circuit 170 is configured to address the memory cells 115 for the write circuit 120 and/or the read circuit 130 to perform operations on the selected memory cells 115. The controller circuit 170 sends the row address and the column address of the selected memory cells 115 to the row selection circuit 140 and column selection circuit 150, respectively, in order to select the addressed memory cells 115 in the memory array 110. Based on the row address and the column address, the row selection circuit 140 and the column selection circuit 150 select the memory cells 115 for the coming up read operation and/or write operation. Therefore, the selected memory cells 115 are accessible by the write circuit 120 and/or the read circuit 130.

In some other embodiments, the controller circuit 170 is further coupled to the write circuit 120 and the read circuit 130 for communicating the data to be written and the data read with the write circuit 120 and the read circuit 130. In some embodiments, the controller circuit 170 is included in a processor (not shown).

In some embodiments, each of the memory cells 115 includes a resistive element 115a and a switch 115b. For illustration in FIG. 1, the resistive element 115a in the memory cell 115 of the memory array 110 is coupled between a corresponding bit line BL and the switch 115b. The switch 115b is coupled between a corresponding source line SL and the resistive element 115a. The switch 115b is further coupled to a corresponding word line WL and controlled with the corresponding word line WL. In some embodiments, the resistive element 115a is implemented by a resistor. In some embodiments, the switch 115b is implemented by a metal-oxide-semiconductor (MOS) transistor.

The above configurations of the memory cell 115 are provided for illustrative purposes. Various configurations are within the contemplated scope of the present disclosure. For example, in various embodiments, the memory cell 115 includes a parasitic resistive element depending on a layout of the memory device 100. For another example, in various embodiments, the switch 115b is implemented by a bipolar junction transistor (BJT).

In some embodiments, the memory device 100 is a phase-change memory (PCM) device. For illustration, the resistive element 115a of the memory cell 115 in the memory device 100 is implemented by a phase-change resistive element. Explained in a different way, the resistive element 115a has a resistance that changes with a phase transition between amorphous and crystalline states. Effectively, the resistance of the resistive elements 115a is changed according to various operating states of the resistive element 115a, as will be explained in detail below. In some embodiments, the phase transition is controlled by controlling a temperature change and the time over which the memory cell 115 is heated and cooled. In some embodiments, the resistive element 115a in the memory cell 115 includes a structural phase-change material, including, for example, $Ge_2Sb_2Te_5$ (GST).

In some embodiments, the resistive element 115a is operated in the crystalline state or the amorphous state. The amorphous state is also referred to as a "RESET" state, and the crystalline state is also referred to as a "SET" state, in some embodiments. The "SET" state and the "RESET" state will be further described in detail below with reference to FIG. 4. In some other embodiments, the amorphous state corresponds to digital data "1" stored in the memory cell 115, and the crystalline state corresponds to digital data "0" stored in the memory cell 115. In some embodiments, either the crystalline state or the amorphous state of the resistive element 115a is determined based on a level of current flowing through the resistive element 115a. For illustration, the resistive element 115a operates in the amorphous state when the current flowing through the resistive element 115a has a relatively low level, and the resistive element 115a operates in the crystalline state when the current flowing through the resistive element 115a has a relatively high level.

Following the discussions above, the current flowing through the resistive element 115a is generated when the switch 115b is turned on. In some embodiments, the switch 115b is controlled to turn on by a programming signal transmitted via the corresponding word line WL. Alternatively stated, the turn-on states of the switch 115b are controlled by the programming signal transmitted via the corresponding word line WL. The level of the current flowing through the resistive element 115a is then determined based on the turn-on states of the switch 115b. On the other hand, when the current flows through the resistive element 115a, heat associated with the resistive element 115a is generated, thus changing the states of the resistive elements 115a. For illustration, the heat associated with the resistive element 115a is generated according to Joule effect on the resistive element 115a, and the temperature of the resistive element 115a is locally raised. Afterwards, the resistive element 115a solidifies under cooling conditions, so that the desired state, as discussed above, and corresponding electrical characteristics of the resistive element 115a are obtained.

In some embodiments, the write circuit 120 is configured to adjust the resistance of the memory cells 115 by applying the programming signals on the corresponding word lines WL, in order to adjust the data stored in the memory cells 115.

In some embodiments, when the memory cells 115 are written by different programming signals, the write circuit 120 is configured to write the memory cells 115 with part of the programming signals. Alternatively stated, the write circuit 120 is configured to divide the programming signals into parts, and write the parts of the programming signals to the memory cells 115. For example, when there is a first memory cell 115 is to be written by a first program signal and a second memory cell 115 is to be written by a second programming signal, in which the first programming signal is part of the second programming signal, the write circuit 120 is able to write the first programming signal to the first memory cell 115 and second memory cell 115. Next, the write circuit 120 is able to write part of the second programming signal to the second memory cell 115, in which the part of the second programming signal is obtained by deducting the first programming signal from the original second programming signal.

Alternatively stated, the write circuit 120 is configured to extract a common signal (e.g., the first programming signal in the example as discussed above) from the programming signals, and then write the common signal to the memory cells 115. Next, after extracting the common signal from the programming signals, the write circuit 120 is configured to obtain a remaining signal (e.g., the second programming signal deducting the first programming signal) from the programming signal being extracted, and write the remaining signal to the memory cells 115. The operations of writing the memory cells 115 will be described below with reference to FIGS. 2, 3A, 3B, and 4.

In some embodiments, the memory cells 115 are operable in a stand-by operation, a write operation, a first read operation, and a second read operation. In some embodiments, when the memory cells 115 are operated under the stand-by operation, the memory cells 115 are not able to be read and written. In the stand-by operation, the row selection circuit 140 is configured to turn the memory cell 115 off by turning off the switch 115b of the memory cell 115. At the same time, the column selection circuit 150 is configured to float (or not to apply voltage to) the bit line BL in order to isolate the memory cell 115 from the write circuit 120 and the read circuit 130. Therefore, the memory cell 115 is not able to be accessed by the write circuit 120 and the read circuit 130. The above stand-by operation is provided for illustrative purposes. Various stand-by operations are within the contemplated scope of the present disclosure. For example, the column selection circuit 150 is configured to apply a stand-by voltage on the bit line BL, and the stand-by voltage is about half a supply voltage in some embodiments.

In some embodiments, in the write operation, the write circuit 120 is configured to write the memory cell 115 being selected by applying the supply voltage on the corresponding bit line BL with applying the programming signals on the corresponding word line WL. Alternatively stated, in the write operation, the write circuit 120 is configured to output the programming signals, corresponding to the data to be stored, to write the memory cell 115 with the supply voltage. The programming voltage is applied on the word line WL selected by the row selection circuit 140. The memory cell 115 is therefore able to store the data being written. The supply voltage is about 2 V (volts), in some embodiments. The programming signals will be described below with reference to FIG. 4.

In some embodiments, in the first read operation, the read circuit 130 is configured to read the data stored in the memory cell 115 by sensing the current flowing through the resistive element 115a of memory cell 115 being selected by apply a reading voltage on the corresponding bit line BL with applying a first control voltage on the corresponding word line WL. Alternatively stated, the read circuit 130 is configured to read current flowing through the memory cell 115 via the corresponding bit line BL selected by the column selection circuit 150. In some embodiments, the reading voltage is about 0.2 V, and the first control voltage is about 1.1 V. In some embodiments, the reading voltage in the first read operation is smaller than the supply voltage in the write operation.

In some other embodiments, when the memory cells 115 are operated under the second read operation, the read circuit 130 is configured to distinguish threshold voltages of the memory cells 115. In the second read operation, the read circuit 130 is configured to sense the current flowing through the resistive element 115a of memory cell 115 in order to distinguish the threshold voltage, in which the memory cell 115 is selected by apply the reading voltage on the corresponding bit line BL with applying a second control voltage on the corresponding word line WL. The reading voltage in the second read operation is substantially equal to the reading voltage in the first read operation. The second control voltage in the second read operation is greater than the first control voltage in the first read operation.

In some embodiments, the programming signals mentioned above includes pulses, and the pulses are controlled by the pulse counter circuit 160. Based on the data to be written and the resistance of the memory cell 115, the pulse counter circuit 160 is configured to generate counter signals indicating the pulse widths and the pulse counts of the programming signals, and the pulse counter circuit 160 is further configured to transmit the counter signals to the write circuit 120 in order to control the pulse widths and/or the pulse counts of the programming signals. Based on the counter signals, the write circuit 120 is then able to write the memory cell 115 with the programming signals having the controlled pulse width and the controlled pulse counts. The resistance of the memory cell 115 is thus adjusted to a desired level, and the memory cell 15 is thus written with the desired value.

The above operations of the pulse counter circuit 160 are provided for illustrative purposes. Various operations of the pulse counter circuit 160 are within the contemplated scope of the present disclosure. For example, in some other embodiments, the pulse counter circuit 160 is configured to generate the programming signals to the write circuit 120. The pulse widths and the pulse counts of the programming signals are controlled by the pulse counter circuit 160. The write circuit 120 receives the programming signals generated by the pulse counter circuit 160, and then write the memory cell 115 by the programming signals.

The elements shown in FIG. 1 are provided for illustrative purposes, but the present disclosure is not limited thereto. For example, in various embodiments, the memory device 100 further includes an input/output circuit (not shown). The input/output circuit is configured for inputting the data outside from the memory device 100, and configured to output the read data from the memory array 110. The input/output circuit is coupled to the write circuit 120, the read circuit 130, and the controller circuit 170.

Figure 2:
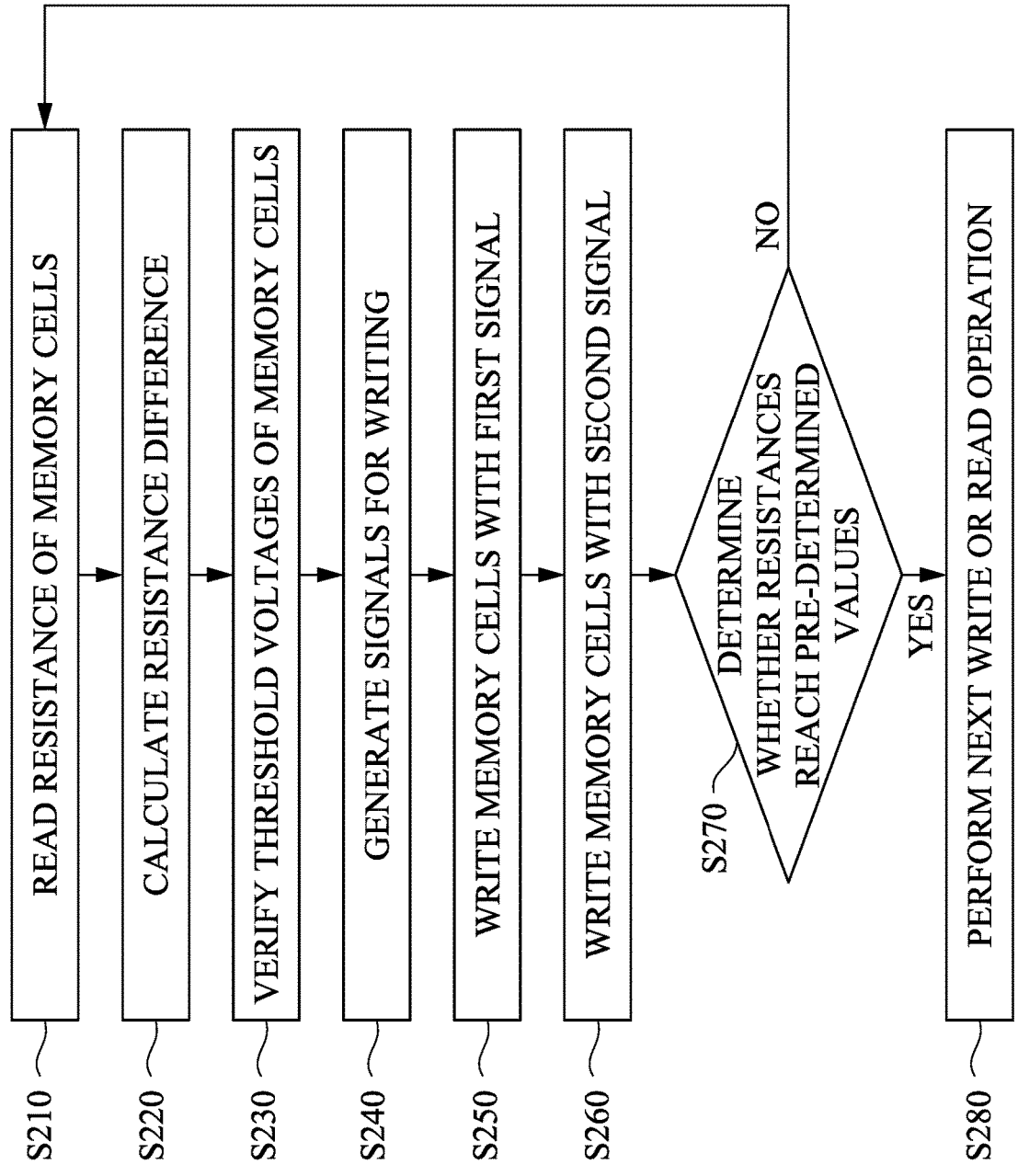
FIG. 2 is a flow chart of a method for operating the memory device shown in FIG. 1, in accordance with some embodiments.

Reference is now made to FIG. 2. FIG. 2 is a flow chart of a method 200 for operating the memory device 100 shown in FIG. 1, according to some embodiments of the present disclosure. For illustration, the method 200 includes operations S210, S220, S230, S240, S250, S260, S270, and S280. In some embodiments, the method 200 is or includes a write operation of the memory device 100.

In operation S210, the resistances of memory cells 115 selected by the row selection circuit 140 and the column selection circuit 150 in the memory array 110 are read by the read circuit 130. The read circuit 130 senses the levels of the currents flowing through the selected memory cells 115 with applying the first reading voltage. According to the levels of the currents sensed in operation S210, the resistances of the memory cells are calculated and known. In some embodiments, the operation S210 corresponds to the first read operation as discussed above.

As discussed above, when the memory cell 115 stores the corresponded data, the memory cell 115 has a specific resistance. Alternatively stated, the corresponded data stored in the memory cell 115 is transformed to a corresponded resistance of the memory cells 115. In operation S220, based on the data to be written and the resistances of the memory cells 115, resistance differences between the resistances corresponding to the data of the memory cells 115 are calculated, which will be exemplarily discussed below with reference to FIG. 3B and FIG. 4.

In operation S230, the threshold voltages of the memory cells 115 are verified. The read circuit 130 senses the levels of the currents flowing through the selected memory cells 115 with applying the second control voltage. According to the levels of currents sensed in operation S230, the threshold voltages of the selected memory cells 115 are known. In some embodiments, the operation S230 corresponds to the second read operation as discussed above. Further description of the threshold voltage verification will be described below with reference to FIG. 4.

In operation S240, based on the resistance differences calculated in operation S220, the pulse counter circuit 160 generates counter signals to the write circuit 120 for generating the programming signals, in which the programming signals are generated for writing the memory cells 115 in the following operations. The write circuit 120 receives the counter signals which indicate the pulse widths and the pulse counts of the programming signals, and then generates the programming signals based on the counter signals. Alternatively stated, the write circuit 120 cooperates with the pulse counter circuit 160 to generate the programming signals for writing the memory cells 115. In some embodiments, the programming signals have a pulse width ranging from about 10 nanoseconds (ns) to about 10 microseconds (μs). For example, the programming signals have a pulse width of 100 ns.

In operation S250, the write circuit 120 writes the memory cells 115 by a first signal to adjust a resistance of at least one first memory cell 115 among the memory cells 115 to a first predetermined resistance value. In some embodiments, the first signal is extracted from the programming signals, and the first signal indicates a common part among the programming signals. For example, the first signal has a pulse height equal to a shortest pulse height among pulse heights of the programming signals. If a specific programming signal is the same as the first signal, the data corresponding to the first predetermined resistance value is the data to be written into the memory cell 115 corresponding to the specific programming signal.

In operation S260, the write circuit 120 writes the memory cells 115 other than the at least one first memory cell 115 by a second signal in order to store data. In some embodiments, the second signal is extracted from the programming signals, and the second signal indicates a remaining part of the programming signals deducting the first signal. For example, the second signal includes a pulse height in addition to the height of the first signal. In some embodiments, the data to be stored correspond to second pre-determined values to which the resistances of the memory cells 115 are adjusted. In some embodiments, the first signal and the second signal as discussed above are pulse signals which have a pulse width ranging from about 10 ns to about 10 μs. In some embodiments, the first signal and the second signal are pulse signals having a stair shape, a trapezoid shape, a triangle shape, or the combination thereof.

In operation S270, the read circuit 130 reads the resistances of the memory cells 115 being written and determines whether the resistances of the memory cells 115 reach the first pre-determined value and the second pre-determined values. In some embodiments, the read circuit 130 compares the resistances being read with the pre-determined values in order to determine whether the resistances of the memory cells 115 reach the first pre-determined value and the second pre-determined values, which will be exemplarily discussed below with reference to FIGS. 3A and 3B.

When the resistances of the memory cells 115 reach the first pre-determined value and the second pre-determined values, the operation S280 is performed. When the resistances of the memory cells 115 do not reach the first pre-determined value or the second pre-determined values, the operation S210 is performed again, and the following operations S220, S230, S240, S250, S260, S270 are performed after the operation S210.

In operation S280, when the resistances of the memory cells 115 reach the first pre-determined value and the second pre-determined values, the present write operation of memory device 100 is done, and a next write or read operation is performed afterward.

The above illustrations include exemplary operations, but the operations are not necessarily performed in the order shown. Operations may be added, replaced, changed order, and/or eliminated as appropriate, in accordance with the spirit and scope of various embodiments of the present disclosure. For example, in various embodiments, when all the programming signals are the same, the first signal is substantially the same as the programming signals, and the operation S260 is able to be omitted. For another example, in alternative embodiments, the write circuit 120 is able to divide the programming signals into more than two parts, and is able to write the memory cells 115 by more than two signals extracted from the programming signals. In other words, there is an additional operation to write the memory cells 115 with another signal performed between the operation S260 and the operation S270. For additional example, the operation S230 is omitted in some other embodiments.

Figure 3A:
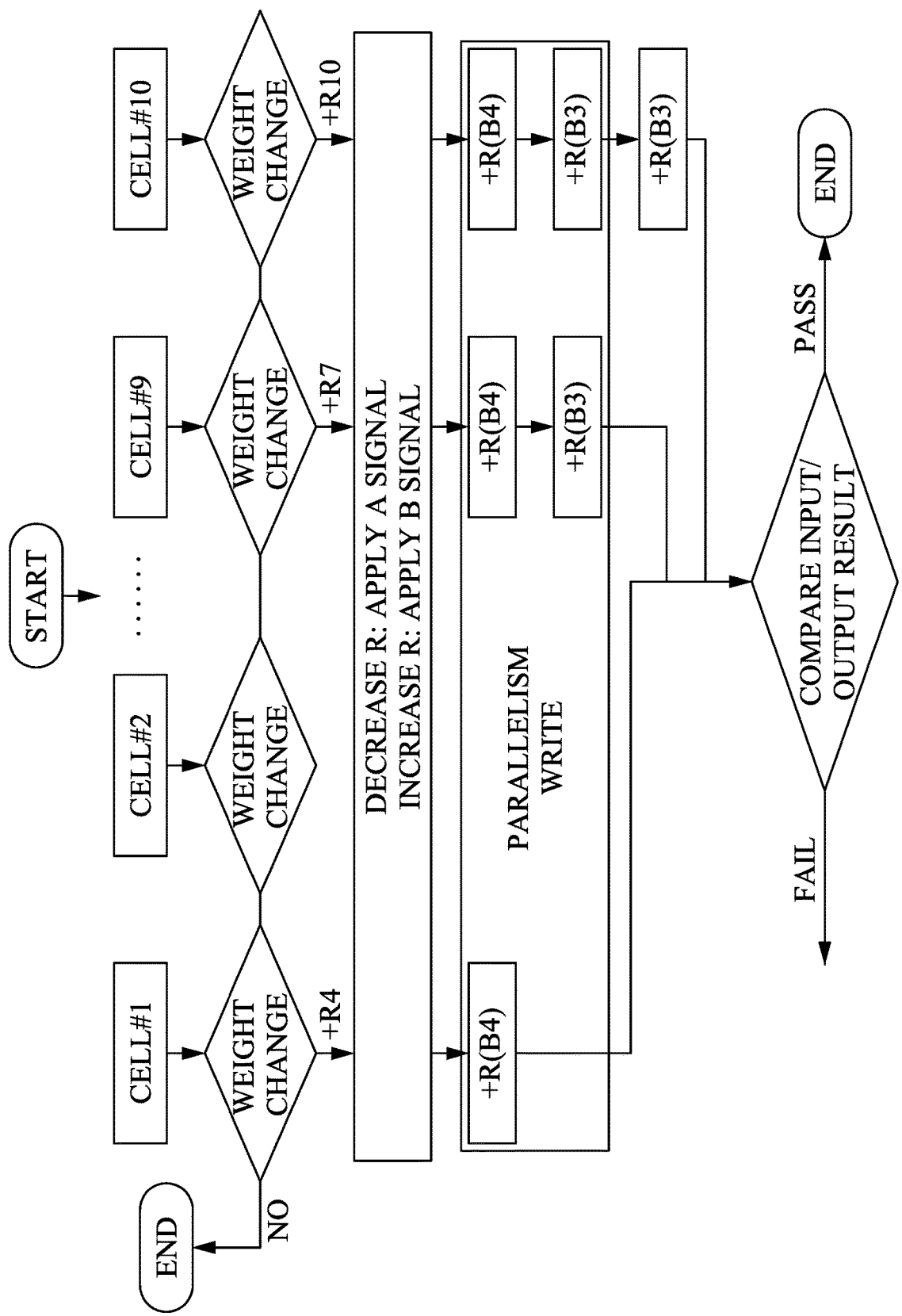
FIG. 3A is a schematic diagram of a write operation, with respect to FIG. 2, of the memory device shown in FIG. 1, in accordance with some embodiments.

Reference is now made to FIG. 3A. FIG. 3A is a schematic diagram of a write operation, with respect to FIG. 2, of the memory device 100 shown in FIG. 1, according to some embodiments of the present disclosure. FIG. 3A illustrates ten memory cells 115 numerated by memory cells CELL #1-#10, and the memory cells CELL #1-#10 are arranged to be coupled to a same word line WL and individual bit lines BL. Alternatively stated, the memory cells CELL #1-#10 are arranged in a same row/column of the memory array 110.

To begin with, the memory cells CELL #1-#10 are read by the read circuit 130 to obtain the resistances of the memory cells CELL #1-#10. This operation corresponds to the operation S210 as illustrated in FIG. 2.

In some embodiments, the term of "WEIGHT" indicates the resistance of the memory cell 115. The diamond boxes indicated by "WEIGHT CHANGE" correspond to operations S220 and S240 as illustrated in FIG. 2. The resistance of each of the memory cells CELL #1-#10 is calculated to obtain the resistance difference between the present resistance and the pre-determined value, and the programming signals are determined based on the resistance differences. For illustration, the resistance difference of the memory cell CELL #1 is indicated as "+R4", the resistance difference of the memory cell CELL #9 is indicated as "+R7", and the resistance difference of the memory cell CELL #10 is indicated as "+R10".

In some embodiments, the designations +R4, +R7, and +R10 indicate the pulse counts of the programming signals written into the memory cells 115. For example, +R4 indicates that the programming signal for the memory cell CELL #1 includes four pulses, and +R10 indicates that the programming signal for the memory cell CELL #10 includes ten pulses. For illustration in FIG. 3A, the first to the fourth pulses in the programming signal for the memory cell CELL #10 is the same as the first to the fourth pulses in the programming signal for the memory cell CELL #1. Similarly, the first to the seventh pulses in the programming signal for the memory cell CELL #10 is the same as the first to the seventh pulses in the programming signal for the memory cell CELL #9.

In some embodiments, when the resistances of the memory cells CELL #1-#10 reach the pre-determined values, the write operation ends. In FIG. 3A, a box indicated by "END" shows the write operation is terminated.

For illustration in the box indicated by "PARALLELISM WRITE", the write circuit 120 extracts a first signal corresponding to +R4 from the programing signals, and writes the first signal to the memory cells CELL #1, CELL #9, and CELL #10 by applying the first signal on the word line WL. The first signal is numerated by "+R(B4)" in FIG. 3A. Alternatively stated, the write circuit 120 parallel writes the memory cells CELL #1, CELL #9, and CELL #10 by applying +R(B4). This operation corresponds to the operation S250.

Still in the box indicated by "PARALLELISM WRITE", the write circuit 120 of FIG. 1 writes the memory cells CELL #9 and CELL #10 by applying a second signal on the word line WL. The second signal is numerated by "+R(B3)" in FIG. 3A. The second signal is obtained by deducting the first signal from the programming signal for the memory cell CELL #9. This operation corresponds to the operation S260.

After the first signal and the second signal are written to the memory cells CELL #1, CELL #9, and CELL #10, the memory cells CELL #1 and CELL #9 have the resistances reaching the per-determined values. The resistance of the memory cell CELL #10 still need be further adjusted by an additional signal (e.g., numerated by "+R(3)" out of the box "PARALLELISM WRITE" in FIG. 3A), in which the first signal, the second signal, and the additional signal construct the programming signal for the memory cell CELL #10. Therefore, the write circuit 120 further writes the memory cell CELL #10 by applying the additional signal on the word line WL.

In some approaches, the write operation for a plurality of memory cells is performed by writing a single memory cell and then reading the memory cell, and writing another single memory cell and then reading. Each write operation coincides with a following up read operation to check if the write operation is performed properly. The time cost of the operations is huge.

Compared to the above approaches, the write operation for memory cells 115 is performed by writing the memory cells 115 until all of the memory cells 115 to be written are completed, and the memory cells 115 are then read to check if the data written into the memory cells 115 reach the desired values. The time cost for read operation is able to be reduced. Furthermore, the write operation is performed by parallel writing to several memory cells 115 at once, the time cost for the writ operation is thus reduced as well.

In the write operations discussed above, the word line WL is coupled to several memory cells 115, and however, not all of the memory cells 115 are necessary to be written in a write operation. In some embodiments, when a portion of memory cells 115 in a row of memory array 110 are written, the selected memory cells 115 to be written are coupled to the corresponding bit lines BL with applying the supply voltage on the corresponding bit lines BL. In contrast, when the other memory cells 115 in the row of memory array 110 are not to be written, the corresponding bit lines BL coupled to the unselected memory cells 115 are floated (or not applied with voltage). Thus, the memory cells 115 with floated bit lines BL will not be written even the word line WL has signals thereon.

For illustration, the resistances of the memory cells CELL #1-#10 are read by the read circuit 130 of FIG. 1 in order to compare the pre-determined values with the read resistances. In some embodiments, the pre-determined value is referred to as input result, and the read resistance is referred to as output result. When the read resistances reach the pre-determined values, the state of the write operation is "PASS" and the write operation ends. When the read resistances do not reach the pre-determined values, the state of the write operation is "FAIL".

Figure 3B:
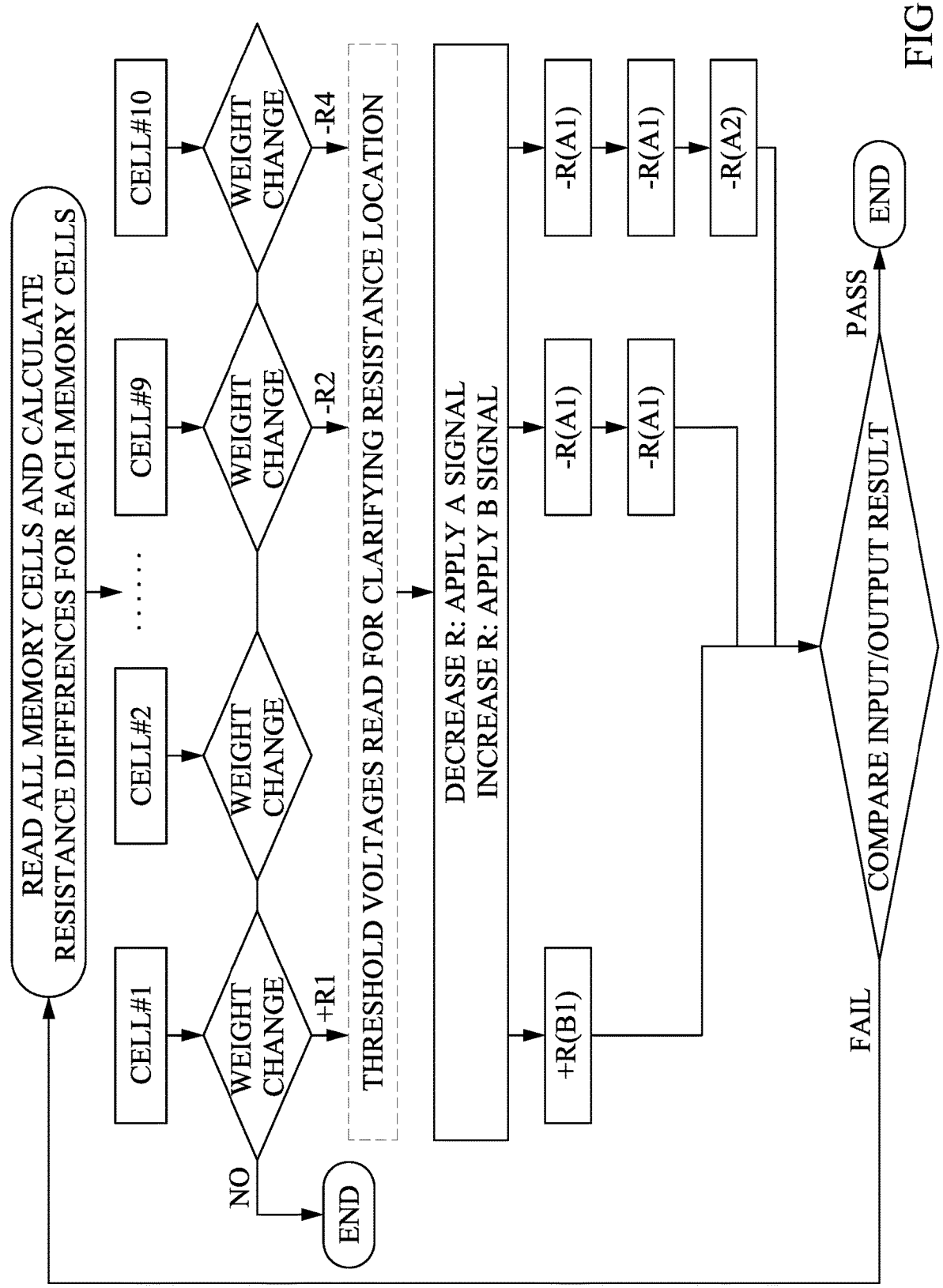
FIG. 3B is a schematic diagram of a write operation, with respect to FIG. 2, of the memory device shown in FIG. 1, in accordance with some other embodiments.

Reference is now made to FIG. 3B. FIG. 3B is a schematic diagram of a write operation, with respect to FIG. 2, of the memory device 100 shown in FIG. 1, according to some other embodiments of the present disclosure. Similar to FIG. 3A, FIG. 3B illustrates ten memory cells 115 numerated by the memory cells CELL #1-#10, and the memory cells CELL #1-#10 are arranged coupling in a some word line WL with individual bit lines BL. Alternatively stated, the memory cells CELL #1-#10 are arranged in a same row of the memory array 110.

To begin with, the memory cells CELL #1-#10 are read by the read circuit 130 to obtain the resistances of the memory cells CELL #1-#10. The operation corresponds to the operation S210 as illustrated in FIG. 2. For illustration, in the box "WEIGHT CHANGE", the resistance of each of the memory cells CELL #1-#10 is calculated to obtain the resistance difference between the present resistance and the pre-determined value, and the programming signals are determined based on the resistance differences. This operation corresponds to the operation S220.

In some embodiments, when the resistances of the memory cells CELL #1-#10 reach the pre-determined values, the write operation ends. In FIG. 3B, a box indicated by "END" shows the write operation is terminated.

For illustration, the resistance difference of the memory cell CELL #1 is indicated as "+R1", the resistance difference of the memory cell CELL #9 is indicated as "−R2", and the resistance difference of the memory cell CELL #10 is indicated as "−R4".

In some embodiments, the reference numbers of "+R1", "+R4", "+R7", and "+R10" shown in FIGS. 3A and 3B indicate the resistances of the corresponding memory cells 115 need be increased, and reference numbers of "−R2" and "−R4" shown in FIG. 3B indicate the resistances of the corresponding memory cells 115 need be decreased.

For illustration, the threshold voltages of the memory cells 115 are verified by performing the second read operation. The read circuit 130 senses the levels of the currents by applying the second control voltage on the word line WL. Based on the levels of currents sensed by the read circuit 130, the threshold voltage is able to be known. In some embodiments, once the threshold voltages of the memory cells 115 are known, the write circuit 120 is able to generate the programming signals based on the counter signals and further based on the threshold voltages of the memory cells 115. This operation corresponds to the operations S230 and S240. The detail description of the threshold associated with the programming signals will be discussed with respect to FIG. 4.

For illustration, since the memory cell CELL #1 is the memory cell 115 need to increase the resistance, it is not necessary to perform parallel write for the memory cell CELL #1. The write circuit 120 does not divide the program signal and directly writes the memory cell CELL #1 by applying programing signal indicated by "+R(B1)". And the write circuit 120 extracts a third signal corresponding to −R2 from the programing signals, and writes the third signal to the memory cells CELL #9 and CELL #10 by applying the third signal on the word line WL. The third signal is numerated by −R(A1) in FIG. 3B. Alternatively stated, the write circuit 120 parallel writes the memory cells CELL #9 and CELL #10. This operation corresponds to the operation S250.

For illustration, the write circuit 120 writes the memory cells CELL #9 and CELL #10 by applying a fourth signal on the word line WL. The fourth signal is numerated by "−R(A1)" in FIG. 3B. The fourth signal is obtained by deducting the third signal from the programming signal for the memory cell CELL #9.

For illustration, the write circuit 120 writes the memory cell CELL #10 by applying a fifth signal on the word line WL. The fifth signal is numerated by "−R(A2)" in FIG. 3B. The fifth signal is obtained by deducting the third signal and the fourth signal from the programming signal for the memory cell CELL #10.

For illustration, the resistances of the memory cells CELL #1-#10 are read by the read circuit 130 in order to compare the pre-determined values with the read resistances. When the read resistances reach the pre-determined values, the state of the write operation is "PASS" and the write operation ends. When the read resistances do not reach the pre-determined values, the state of the write operation is "FAIL", and the operation will go back to the top of FIG. 3B. When the read resistances do not reach the pre-determined values, the write operation will be performed again to make the memory cells 115 have the pre-determined values.

Figure 4:
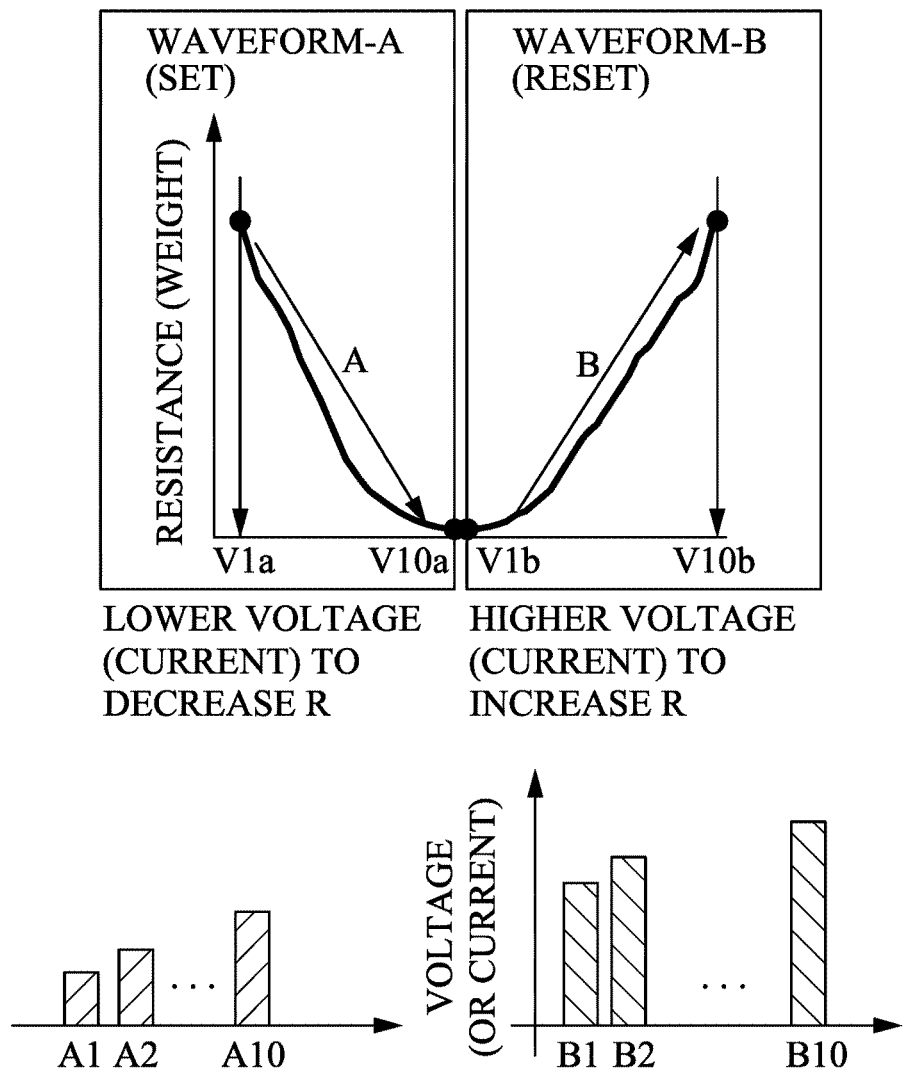
FIG. 4 is a schematic diagram of characteristic of the resistive element in the memory cell shown in FIG. 1 and a schematic diagram of the programming signals, in accordance with some other embodiments.

Reference is now made to FIG. 4. FIG. 4 is a schematic diagram of characteristic of the resistive element 115a in the memory cell 115 shown in FIG. 1 and a schematic diagram of the programming signals, according to some embodiments of the present disclosure.

In some embodiments, the memory cells 115 are phase-change memory. The memory cells 115 have the characteristic shown in the upper part of FIG. 4. Alternatively stated, the resistive element 115a in the memory cell 115 has the characteristic shown in the upper part of FIG. 4.

For illustration in FIG. 4, the upper part of FIG. 4 illustrates a diagram of the resistance of the resistive element 115a versus applied voltages. The diagram in the upper part includes two portions. The left portion is indicated by "WAVEFORM-A (SET)". The right portion is indicated by "WAVEFORM-B (RESET)". In the upper part of FIG. 4, the left axis indicates resistance increasing from the bottom to the top of the diagram, and the bottom axis indicates voltage increasing from the left side to the right side of the diagram. When the voltage applied on the memory cell 115 is known, the resistance of the memory cell 115 is able to be known according to the diagram in the upper part of FIG. 4.

In the left portion of FIG. 4, the resistance of the resistive element 115a decreases with increasing applied voltage (e.g., increasing from V1a to V10a). In the right portion, the resistance of the resistive element 115a increases with increasing applied voltage (e.g., increasing from V1b to V10b). As illustrated in FIG. 4, the applied voltages V1a to V10a are smaller than the applied voltages V1b to V10b, and the applied voltage is gradually increased from V1a to V10a and/or from V1b to V10b. For example, with reference to FIG. 4, when the resistance of the memory cell 115 is 200 Kohm (corresponding to V1a) and the memory cell 115 is set to have a predetermined resistance value of 50 Kohm (corresponding to the voltage between V1a and V10a), the first signal and the second signal as discussed above are applied on the memory cell 115, in order for the resistance of the memory cell 115 to decrease to the predetermined resistance value of 50 Kohm. In some embodiments, the predetermined resistance value ranges between about 20 and about 5000 Kohm, for example. In some embodiments, the applied voltage in the range between V1a and V10a ranges from greater than 0 V to about 0.8 V, while the applied voltage in the range between V1b and V10b ranges from about 1 V to about 2 V, for example.

In the above illustration, the resistance of the memory cell 115 is to be decreased, while the first signal and the second signal have voltage levels within the range between V1a and V10a with respect to the portion WAVEFORM-A (SET) as shown in FIG. 4. For example, the first signal has a voltage level of 0.4 V between V1a and V10a, and the second signal has a voltage level of 0.5 V. After the first signal is applied to the memory cell 115, the resistance of the memory cell 115 is adjusted from 200 Kohm to 100 Kohm (corresponding to the voltage between V1a and V10a). After the second signal is applied to the memory cell 115, the resistance of the memory cell 115 is further adjusted from 100 Kohm to 50 Kohm. As a result, the resistance of the memory cell 115 reaches the predetermined resistance value.

In some embodiments, when the resistive element 115a is presented as the characteristic shown in the left portion, the memory cell 115 is presented in the SET state, and the memory cell 115 is storing a data indicating digital value "0". In some embodiments, when the resistive element 115a is presented the characteristic shown in the right portion, the memory cell 115 is presented in the RESET state, and the memory cell 115 is storing a data indicating digital value "1".

For illustration in FIG. 4, the lower part of FIG. 4 illustrates a schematic diagram of programming signals generated by the write circuit 120 as shown in FIG. 1. The diagram in the lower part includes two portions. The left portion illustrates various voltages of a programming signal for decreasing the resistance of the memory cell 115, which correspond to the voltages in the range with respect to the portion WAVEFORM-A (SET) as discussed above. The right portion illustrates various voltages of a programming signal for increasing the resistance of the memory cell 115, which correspond to the voltages in the range with respect to the portion WAVEFORM-B (RESET) as discussed above. The voltage (or current) axis indicates voltage (or current) increasing from the bottom to the top. In the illustration of FIG. 4, the "voltages" of a programming signal are also referred to as "voltage levels" or "pulse heights" in some embodiments. For illustration of FIG. 4, the programming signals are constructed by pulses with increasing voltage. The pulses A1-A10 in the left portion correspond to the voltages in the range between V1$a$ and V10$a$ of WAVEFORM-A (SET) as illustrated in the upper part of FIG. 4. The pulses B1-B 10 in the right portion correspond to the voltages in the range between V1$b$ and V10$b$ of WAVEFORM-B (RESET) as illustrated in the upper part of FIG. 4. Alternatively stated, each one of the pulses A1-A10 is smaller than each one of the pulses B1-B10. In other words, voltages of a programming signal for increasing the resistance of the memory cell 115 are greater than voltages of a programming signal for decreasing the resistance of the memory cell 115 in the illustration of FIG. 4. In some embodiments, the first signal and the second signal as discussed above are each implemented by the pulse signal as illustrated in FIG. 4, which has a pulse width ranging from about 10 ns to about 10 μs, for example. In further embodiments, the pulse signal implementing the first signal and/or the second signal as discussed above has a stair shape, a trapezoid shape, a triangle shape, or the combination thereof.

In some embodiments, when the resistance of a memory cell 115 is going to be increased, the write circuit 120 is configured to generate a programming signal having at least one pulse belonging to the right portion of the lower part of FIG. 4. In some embodiments, when the resistance of a memory cell 115 is going to be decreased, the write circuit 120 is configured to generate a programming signal having at least one pulse belonging to the left portion of the lower part of FIG. 4.

In some embodiments, when the memory cell 115 is written by a programming signal belonging to the right portion of the lower part of FIG. 4, the memory cell 115 is transited to be presented a characteristic of WAVEFORM-B (RESET). In some embodiments, when the memory cell 115 is written by a programming signal belonging to the left portion of the lower part of FIG. 4, the memory cell 115 is transited to be presented a characteristic of WAVEFORM-A (SET).

Alternatively stated, when the resistance of the memory cell 115 is increased, the memory 115 is transited to be presented a characteristic of WAVEFORM-B (RESET). When the resistance of the memory cell 115 is decreased, the memory 115 is transited to be presented a characteristic of WAVEFORM-A (SET).

In some embodiments, the threshold voltage of the memory cell 115 presenting the characteristic of WAVEFORM-A (SET) is lower than the threshold voltage of the memory cell 115 presenting the characteristic of WAVEFORM-B (RESET). In some embodiments, the memory cell 115 presenting the characteristic of WAVEFORM-A (SET) has the threshold voltage ranging from about 0.1 V to about 0.4 V. In some embodiments, the memory cell 115 presenting the characteristic of WAVEFORM-B (RESET) has the threshold voltage ranging from about 0.6 V to about 1.0 V.

Reference is made back to FIG. 2. In operation S230, read circuit 130 sense the levels of the currents with applying the second control voltage on the word line WL in order to verify the threshold voltages of the memory cells 115. In some embodiments, the second control voltage is ranged between the threshold voltage of a memory cell 115 presenting the characteristic of WAVEFORM-A (SET) and a memory cell presenting the characteristic of WAVEFORM-B (RESET). In some embodiments, the second control voltage is arranged from about 0.4 V to about 0.6 V, for example, the second control voltage is 0.5 V. The second control voltage is also referred to as a reference voltage, in some embodiments.

When the second control voltage is applied on the word line WL, the memory cell 115 presenting the characteristic of WAVEFORM-A (SET) will be turn on because the threshold voltage of the memory cell 115 is smaller than the second control voltage. And a sensible or detectable current is able to be sensed by the read circuit 130. Alternatively stated, once the current is sensible, the threshold voltage of the memory cell 115 is verified, and the memory cell is categorized to having the characteristic of WAVEFORM-A (SET).

In contrast, when the second control voltage is applied on the word line WL, the memory cell 115 presenting the characteristic of WAVEFORM-B (RESET) will be turn off because the threshold voltage of the memory cell 115 is greater than the second control voltage. And an un-sensible or a relatively small current is not able to be sensed by the read circuit 130. Alternatively stated, once the current is un-sensible or relatively small, the threshold voltage of the memory cell 115 is verified, and the memory cell is categorized to having the characteristic of WAVEFORM-B (RESET).

In some embodiments, the pulse width of the programming signal for the memory cell 115 having the characteristic of WAVEFORM-A(SET) is about 1-100 times wider than the pulse width of the programming signal for the memory cell 115 having the characteristic of WAVEFORM-B(RESET). Alternatively stated, the pulse width of the programming signal for the memory cell having the threshold voltage lower than the reference voltage(second control voltage) is about 1-100 times wider than the pulse width of the programming signal for the memory cell having the threshold voltage higher than the reference voltage.

In some embodiments, when the memory cell 115 has the characteristic of WAVEFORM-A(SET), the pulses in the programming signals have stair-down shapes, i.e., ramping down. When the memory cell 115 has the characteristic of WAVEFORM-B(RESET), the pulses in the programming signals have box shapes, for example, the rectangle as illustrated in the lower part of FIG. 4.

In some embodiments, a method is disclosed including following operations. A first signal is applied to memory cells in a memory device, to adjust resistance values of the memory cells. After the first signal is applied, a second signal is applied to the memory cells other than a first memory cell in the memory cells, to further adjust the resistance values of the plurality of memory cells other than the first memory cell.

In various embodiments, a voltage level of the second signal is greater than a voltage level of the first signal, applying the first signal is performed to decrease the resistance values of the memory cells, and applying the second signal is performed to further decrease the resistance values of the memory cells other than the first memory cell.

In various embodiments, applying the first signal is performed to increase the resistance values of the memory cells, and applying the second signal is performed to further increase the resistance values of the memory cells other than the first memory cell.

In various embodiments, the method further includes the following operations. After applying the first signal and the second signal, when a resistance value of the first memory cell does not reach a first predetermined resistance value and/or a resistance value of a second memory cell in the memory cells does not reach a second predetermined resistance value, differences between the resistance value of the first memory cell and the first predetermined resistance value and/or between the resistance value of the second memory cell and the second predetermined resistance value are calculated, and based on the differences, corresponding signals are applied to the first memory cell and/or the second memory cell, to further adjust the resistance values of the first memory cell and/or the second memory cell.

In various embodiments, the method further includes the following operation. After applying the first signal, before applying the second signal, no reading operation of retrieving a resistance value of the first memory cell for verification is performed.

In various embodiments, the first signal and the second signal are pulse signals, and a voltage level of the second signal is greater than a voltage level of the first signal.

In various embodiments, the method further includes the following operation. Levels of threshold voltages of the memory cells are verified. Applying the first signal and applying the second signal are performed according to the verified levels of threshold voltages of the memory cells.

In various embodiments, the method further includes: generating programming signals based on the threshold voltages; and extracting the first signal and the second signal from the programming signals.

Also disclosed is a method includes following operations. The first memory cells of memory cells are written with a first group of pulses; and second memory cells of memory cells are written with a second group of pulses. The first group of pulses are configured to decrease resistance values of the first memory cells. The second group of pulses are configured to increase resistance values of the second memory cells.

In various embodiments, writing the first memory cells with the first group of pulses includes writing the first memory cells with a first pulse in the first group of pulses, and writing at least one memory cell in the first memory cells with a second pulse in the first group of pulses.

In various embodiments, a voltage level of the first pulse is lower than a voltage level of the second pulse.

In various embodiments, writing the first memory cells with the first pulse is performed to decrease resistance values of the first memory cells, and writing the at least one memory cell with the second pulse is performed to further decrease a resistance value of the at lease on memory cell.

In various embodiments, writing the second memory cells with the second group of pulses includes the following operation. After writing the second memory cells with a first pulse in the second group of pulses, at least one memory cell in the second memory cells is written with a second pulse in the second group of pulses.

In various embodiments, the method further includes: detecting threshold voltages of the plurality of memory cells; and generating the first group of pulses and the second group of pulses based on the threshold voltages.

Also disclosed is a memory device includes memory cells and a write circuit. The write circuit is coupled to the memory cells. The write circuit is configured to write the memory cells to adjust resistance values of the memory cells, and further configured to write at least one first memory cell in the memory cells to further adjust the resistance value of the at least one first memory cell.

In various embodiments, the memory device further includes a read circuit coupled to the memory cells. The read circuit is configured to read the memory cells in order to compare pre-determined resistance values with resistances values of the memory cells.

In various embodiments, the memory device further includes a pulse counter circuit coupled to the write circuit. The pulse counter circuit is configured to generate, based on differences of the pre-determined values with the resistance values of the memory cells, counter signals for adjusting the resistance values of the memory cells.

In various embodiments, the memory device further includes a row selection circuit and a column selection circuit. The row selection circuit is coupled to word lines that are coupled to the memory cells, and the row selection circuit is configured to select memory cells, to be written based on the counter signals through corresponding word lines in the word lines. The column selection circuit is coupled to bit lines that are coupled to the memory cells, and the column selection circuit is configured to select at least one of the bit lines in order to transmit currents in response to the resistance value of the memory cells.

In various embodiments, the read circuit is configured to distinguish threshold voltages of the memory cells based on currents flowing through the memory cells. The resistances values of the memory cells are verified based on the threshold voltages.

In various embodiments, each of the memory cells includes a resistor and a switch. The resistor includes a phase-change material, and data stored in each of the memory cells corresponds to a resistance value presented by the resistor. The switch is coupled to the resistor and configured to be controlled by the write circuit in order to conduct a current flowing through the resistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
applying a first signal to a plurality of memory cells in a memory device, to adjust resistance values of the plurality of memory cells;
after applying the first signal, applying a second signal to the plurality of memory cells other than a first memory cell in the plurality of memory cells, to further adjust the resistance values of the plurality of memory cells other than the first memory cell;
when a resistance value of the first memory cell does not reach a first predetermined resistance value, calculating a first difference between the resistance value of the first memory cell and the first predetermined resistance value; and adjusting the resistance value of the first memory cell based on the first difference.

2. The method of claim 1, wherein
a voltage level of the second signal is greater than a voltage level of the first signal,
applying the first signal is performed to decrease the resistance values of the plurality of memory cells, and
applying the second signal is performed to further decrease the resistance values of the plurality of memory cells other than the first memory cell.

3. The method of claim 1, wherein
applying the first signal is performed to increase the resistance values of the plurality of memory cells, and
applying the second signal is performed to further increase the resistance values of the plurality of memory cells other than the first memory cell.

4. The method of claim 1, further comprising:
after applying the first signal and the second signal,
when a resistance value of a second memory cell in the plurality of memory cells does not reach a second predetermined resistance value,
calculating a second difference between the resistance value of the second memory cell and the second predetermined resistance value, and
based on the first difference and the second difference, applying corresponding signals to the first memory cell and/or the second memory cell, to further adjust the resistance values of the first memory cell and/or the second memory cell.

5. The method of claim 1, further comprising:
after applying the first signal, before applying the second signal, performing no reading operation of retrieving the resistance value of the first memory cell for verification.

6. The method of claim 1, wherein the first signal and the second signal are pulse signals, and a voltage level of the second signal is greater than a voltage level of the first signal.

7. The method of claim 1, further comprising:
verifying levels of threshold voltages of the plurality of memory cells, wherein applying the first signal and applying the second signal are performed according to the verified levels of threshold voltages of the plurality of memory cells.

8. The method of claim 7, further comprising:
generating programming signals based on the threshold voltages; and
extracting the first signal and the second signal from the programming signals.

9. A method, comprising:
writing first memory cells of a plurality of memory cells with a first group of pulses, wherein the first group of pulses are configured to decrease resistance values of the first memory cells;
writing second memory cells of the plurality of memory cells with a second group of pulses, wherein the second group of pulses are configured to increase resistance values of the second memory cells;
detecting threshold voltages of the plurality of memory cells; and
generating the first group of pulses based on the threshold voltages.

10. The method of claim 9, wherein writing the first memory cells with the first group of pulses comprises:
writing the first memory cells with a first pulse in the first group of pulses; and
writing at least one memory cell in the first memory cells with a second pulse in the first group of pulses.

11. The method of claim 10, wherein a voltage level of the first pulse is lower than a voltage level of the second pulse.

12. The method of claim 10, wherein
writing the first memory cells with the first pulse is performed to decrease resistance values of the first memory cells, and writing the at least one memory cell with the second pulse is performed to further decrease a resistance value of the at least one memory cell.

13. The method of claim 9, wherein writing the second memory cells with the second group of pulses comprises:
after writing the second memory cells with a first pulse in the second group of pulses, writing at least one memory cell in the second memory cells with a second pulse in the second group of pulses.

14. The method of claim 9, further comprising:
generating the second group of pulses based on the threshold voltages.

15. A memory device, comprising:
a plurality of memory cells;
a write circuit coupled to the plurality of memory cells, wherein the write circuit is configured to write the plurality of memory cells, to adjust resistance values of the plurality of memory cells, and further configured to write at least one first memory cell in the plurality of memory cells to further adjust the resistance value of the at least one first memory cell; and
a pulse counter circuit coupled to the write circuit and configured to adjust the resistance values of the plurality of memory cells based on differences between predetermined resistance values and the resistance values of the plurality of memory cells.

16. The memory device of claim 15, further comprising:
a read circuit coupled to the plurality of memory cells,
wherein the read circuit is configured to read the plurality of memory cells in order to compare the predetermined resistance values with the resistance values of the plurality of memory cells.

17. The memory device of claim 16,
wherein the pulse counter circuit is further configured to generate, based on the differences of the predetermined resistance values with the resistance values of the plurality of memory cells, counter signals for adjusting the resistance values of the plurality of memory cells.

18. The memory device of claim 17, further comprising:
a row selection circuit coupled to word lines that are coupled to the plurality of memory cells, wherein the row selection circuit is configured to select memory cells in the plurality of memory cells, to be written based on the counter signals through corresponding word lines in the word lines; and
a column selection circuit coupled to bit lines that are coupled to the plurality of memory cells, wherein the column selection circuit is configured to select at least one of the bit lines in order to transmit currents in response to the resistance values of the plurality of memory cells.

19. The memory device of claim 16, wherein the read circuit is configured to distinguish threshold voltages of the plurality of memory cells based on currents flowing through the plurality of memory cells, and
the resistances values of the plurality of memory cells are verified based on the threshold voltages.

20. The memory device of claim 15, wherein each of the plurality of memory cells comprises:

a resistor comprising a phase-change material, wherein data stored in each of the plurality of memory cells corresponds to a resistance value presented by the resistor; and a switch coupled to the resistor and configured to be controlled by the write circuit in order to conduct a current flowing through the resistor.

* * * * *